United States Patent [19]

Schucker

[11] Patent Number: 5,006,486
[45] Date of Patent: Apr. 9, 1991

[54] DIRECT CONTACT TAB METHOD
[75] Inventor: Douglas W. Schucker, Mesa, Ariz.
[73] Assignee: Motorola, Inc., Schaumburg, Ill.
[21] Appl. No.: 471,763
[22] Filed: Jan. 29, 1990
[51] Int. Cl.$^5$ .......................................... H01L 21/603
[52] U.S. Cl. ........................................ 437/220; 357/70
[58] Field of Search .................. 437/209, 220; 357/70, 357/80, 69; 361/421; 156/633; 235/488; 174/52.4; 219/121.6

[56] References Cited

U.S. PATENT DOCUMENTS 4,539,472  9/1985  Poetker et al. ...................... 235/488
4,903,113  2/1990  Frankeny et al. ..................... 357/70

*Primary Examiner*—Olik Chaudhuri
*Assistant Examiner*—David E. Graybill
*Attorney, Agent, or Firm*—Harry A. Wolin

[57] ABSTRACT

An external contact method and package wherein one embodiment includes a semiconductor die having a plurality of metallization layers including a top metallization layer that is covered by a passivating layer. At least a portion of the passivating layer is removed to expose at least a portion of the top metallization layer. Once the top metallization layer is exposed, external contact means are press-fit directly into the exposed portion. In a high powered ECL circuit, the present invention eliminates or greatly decreases voltage drop problems along the power bus lines which cause logic errors if the voltage drop is too large.

10 Claims, 1 Drawing Sheet

DIRECT CONTACT TAB METHOD

BACKGROUND OF THE INVENTION

This invention relates, in general, to semiconductor devices, and more particularly to a method of making external contact to a semiconductor die.

External contact is often made to semiconductor dice by methods such as tape automated bonding (TAB). Typically, the internal metallization of a semiconductor die is coupled to a bond pad or bump on the outer periphery of the semiconductor die surface. The bond pads or bumps are generally made of compressible metal so that external contact means such as the leads of a lead frame may be press-fit therein. TAB bonding eliminates the need for troublesome wire bonding.

Many high powered semiconductor dice such as those including emitter coupled logic (ECL) circuits having upwards of 50,000 gates and power upwards of 70 watts on a single chip often employ TAB bonding. For example, an ECL circuit fabricated by Motorola's MOSAIC IV process technology includes four metal layers selectively coupled by via interconnect technology. The top metal layer is a power bus layer that couples external power sources to the internal logic elements. The power bus layer is coupled to the external power sources through bond pads or bumps as described above.

Many problems are prevalent when conventional TAB bonding methods are used to externally contact high powered semiconductor dice. For example, large amounts of current demand power buses that are very substantial in size. To handle the desired current, the power buses are often too large for the die on which they are employed. Conversely, if these power buses are not large enough to meet current requirements, electromigration problems may occur throughout the power buses. The above problems are especially prevalent in those portions of the internal metallization that couple the actual power bus lines to the peripheral bond pads and bumps. Another common problem is the loss of voltage through bus drop. If the bus drop becomes too large, logic errors occur and cause the circuit to not function properly.

Accordingly, it would be highly desirable to develop a method of making external contact to a semiconductor die that allows for smaller power buses that will adequately handle high currents without electromigration deficiencies or detrimental bus drop.

SUMMARY OF THE INVENTION

Accordingly, it is an object of the present invention to provide a method of making external contact to a semiconductor die that may be employed with relatively high powered devices.

Another object of this invention is to provide a method of making external contact to a semiconductor die that eliminates or greatly reduces electromigration problems.

It is an additional object of the present invention to provide a method of making external contact to a semiconductor die that eliminates or greatly reduces voltage drop along power bus lines.

A further object of the present invention is to provide a method of making external contact to a semiconductor die that allows power bus size to be reduced.

An even further object of the present invention to provide a method of making external contact to a semiconductor die wherein contact is made directly to a power bus.

The foregoing and other objects and advantages are achieved in the present invention by one embodiment in which, as part thereof, includes providing a semiconductor die having a plurality of metallization layers including a top metallization layer that is employed as a power bus. At least a portion of the top metallization layer is exposed and external contact means are press-fit directly into the exposed portion of the top metallization layer. It should be understood that the exposed portion of the top metallization layer should be of a TAB bond compatible metal such as gold.

A more complete understanding of the present invention can be attained by considering the following detailed description in conjunction with the accompanying drawings.

DETAILED DESCRIPTION OF THE INVENTION

Figure 1:
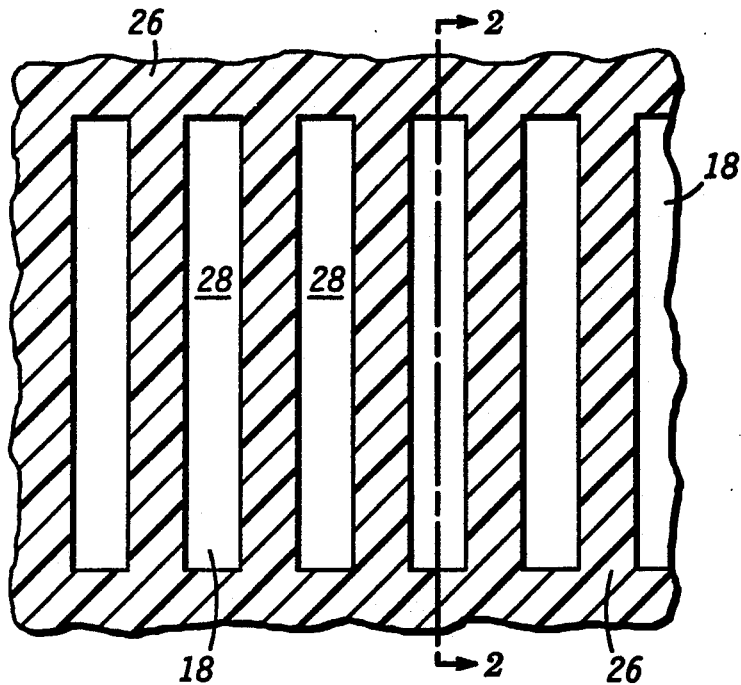
FIG. 1 is a highly enlarged top view of a semiconductor die embodying the present invention.
Figure 2:
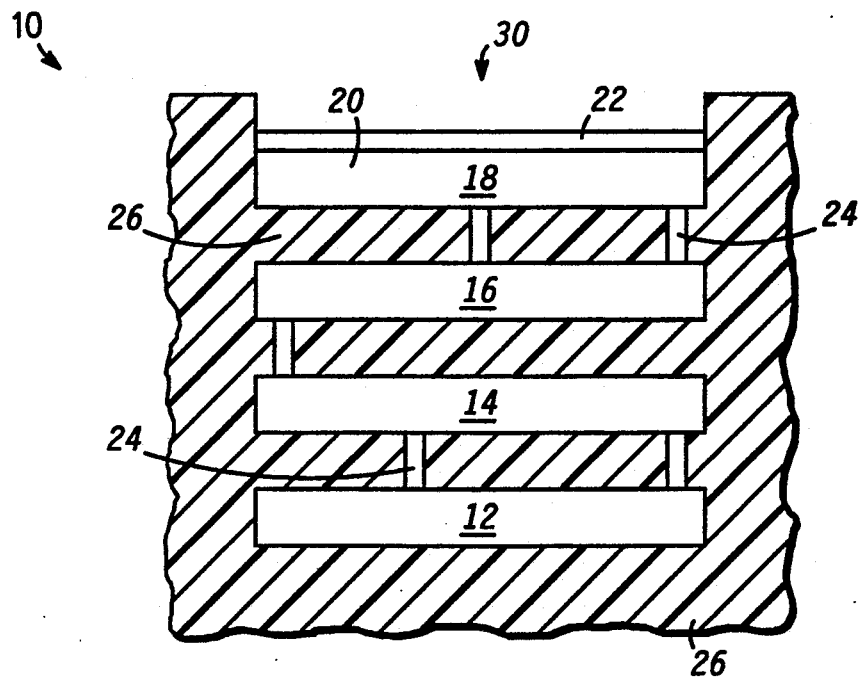
FIG. 2 is a highly enlarged cross-sectional view of the semiconductor die of FIG. 1 taken from cross-section line 2—2.

FIG. 1 is a highly enlarged top view of a semiconductor die 10 embodying the present invention while FIG. 2 is a highly enlarged cross sectional view of semiconductor die 10 taken from cross-section line 2—2 of FIG. 1. Semiconductor die 10 includes a first metallization layer 12, a second metallization layer 14, a third metallization layer 16 and a top metallization layer 18. First metallization layer 12, second metallization layer 14 and third metallization layer 16 comprise an aluminum alloy in this embodiment although they may comprise one of many metals well known in the semiconductor art. Top metallization layer 18 comprises a first portion 20 comprised of the same aluminium alloy as metallization layers 12, 14 and 16 and a second portion 22 disposed on first portion 20 that is comprised of gold. Although second portion 22 comprises gold in this embodiment, it may comprise one of many well known metals commonly used in TAB bonding. In another embodiment, top metallization layer 18 may comprise a single layer of TAB bond compatible metal.

Metallization layers 12, 14, 16 and 18 are interconnected by vias 24 which extend through isolating regions 26. Vias 24 are well known in the art. Isolating regions 26 comprise one or more of many well known dielectric materials including oxides, nitrides and the like. Interconnected multi-layer metallization systems such as that disclosed herein are well known in the art.

A typical high powered semiconductor die such as one containing an ECL circuit having upwards of 50,000 gates and power capabilities upwards of 70 watts on a single chip often employ TAB bonding to couple external power sources to internal logic elements. An ECL circuit of this magnitude processed by Motorola's MOSAIC IV process flow includes four metallization layers, the top metallization layer being a power bus layer. The power bus layer is generally coupled to bond pads or bumps on the periphery of the semiconductor die. External contact means such as the leads of a lead frame are then TAB bonded to the bond pads or bumps. In a semiconductor die containing a high powered ECL circuit, the power bus lines must be substantial in size. This creates problems because the power buses are often too big for the semiconductor die. However, if the power buses are not big enough, electromigration problems occur along the power buses. Further, voltage drop problems along the power bus lines often occur. If the voltage drop is too large, logic errors occur as a result.

The aforementioned problems may be eliminated or greatly decreased by forming an opening 30 that exposes at least a portion of a power bus line 28. Opening 30 may be formed by etching through a passivating layer (not shown) covering top metallization layer 18. By exposing power bus line 28, contact may be made directly thereto by external contact means such as the leads of a lead frame. This results in current from external sources not having to travel unnecessary distances through bond pads and vias to reach power bus lines 28. This also allows for power bus lines 28 to be scaled back. Although the embodiment depicted in FIGS. 1-2 shows power bus lines 28 being completely exposed, it should be understood that partial exposure of power bus lines 28 that allows direct contact to be made thereto is also sufficient.

As with any TAB bonding process, the metal in which the TAB bonding actually occurs must be relatively compressible so that external contact means may be press-fit therein. As explained earlier, the entire power bus line 28 may comprise a TAB bond compatible metal or second portion 22 of top metallization layer 18 may comprise a TAB bond compatible metal such as gold. It should be understood that although the metal must be compressible, it must not be so compressible that it deforms to a large extent and causes shorts between various power bus lines 28.

Thus it is apparent that there has been provided, in accordance with the invention, an improved external contact method and package which meets the objects and advantages set forth above. While specific embodiments of the present invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of the present invention.

What is claimed is:

1. A method of connecting a TAB leadframe to the internal metallization of a semiconductor die comprising the steps of:
   providing a semiconductor die having at least one metallization layer;
   exposing at least a portion of said at least one metallization layer; and
   directly contacting said exposed portion of said at least one metallization layer with a TAB leadframe.

2. The method of claim 1 wherein the providing step includes providing a semiconductor die having multiple metallization layers and the exposing step includes exposing the top metallization layer.

3. The method of claim 2 wherein the top metallization layer comprises a relatively compressible metal so that direct contact may be made thereto by TAB bonding.

4. The method of claim 3 wherein the top metallization layer includes a layer of gold disposed thereon.

5. The method of claim 4 wherein the semiconductor die includes an emitter coupled logic circuit and the top metallization layer is a power bus layer that couples external power sources to internal logic elements.

6. A method of making external contact to a semiconductor die comprising the steps of:
   providing a semiconductor die having a plurality of metallization layers including a top metallization layer, said top metallization layer being covered by a passivating layer;
   removing at least a portion of said passivating layer to expose at least a portion of said top metallization layer; and
   press-fitting external contact means directly into said exposed portion of said top metallization layer.

7. The method of claim 6 wherein the top metallization layer comprises a relatively compressible metal so that direct contact may be made thereto by TAB bonding.

8. The method of claim 7 wherein the top metallization layer includes a layer of gold disposed thereon.

9. The method of claim 6 wherein the semiconductor die includes an emitter coupled logic circuit and the top metallization layer is a power bus layer that couples external power sources to internal logic elements.

10. The method of claim 6 wherein external contact means comprise a lead frame.

* * * * *